(12) United States Patent
Chen et al.

(10) Patent No.: US 9,431,097 B2
(45) Date of Patent: Aug. 30, 2016

(54) VOLATILE/NON-VOLATILE SRAM DEVICE

(71) Applicant: QUALCOMM Incorporated, San Diego, CA (US)

(72) Inventors: Xiaonan Chen, San Diego, CA (US); Zhongze Wang, San Diego, CA (US); Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/579,891

(22) Filed: Dec. 22, 2014

(65) Prior Publication Data

US 2016/0180925 A1 Jun. 23, 2016

(51) Int. Cl.
*G11C 11/00* (2006.01)
*G11C 11/419* (2006.01)

(52) U.S. Cl.
CPC .................................. *G11C 11/419* (2013.01)

(58) Field of Classification Search
USPC .................................... 365/154, 156, 189.09
See application file for complete search history.

(56) References Cited

U.S. PATENT DOCUMENTS

| | | | |
|---|---|---|---|
| 5,956,269 A | 9/1999 | Ouyang et al. | |
| 6,556,487 B1 * | 4/2003 | Ratnakumar | G11C 14/00 365/154 |
| 6,847,562 B2 | 1/2005 | King | |
| 7,705,660 B2 | 4/2010 | Lee | |
| 8,139,437 B2 | 3/2012 | Kim et al. | |
| 8,410,772 B1 | 4/2013 | Potluri | |
| 8,806,395 B1 | 8/2014 | Clark et al. | |
| 2007/0211520 A1 | 9/2007 | Dedieu et al. | |
| 2008/0225590 A1 * | 9/2008 | Lamorey | G11C 14/0081 365/185.05 |
| 2009/0228739 A1 * | 9/2009 | Cohen | G06F 11/1072 714/6.12 |

OTHER PUBLICATIONS

International Search Report and Written Opinion—PCT/US2015/063495—ISA/EPO—Feb. 18, 2016.

* cited by examiner

*Primary Examiner* — Vu Le
(74) *Attorney, Agent, or Firm* — Toler Law Group, PC (57) ABSTRACT

A method of operation of a static random access memory (SRAM) storage element includes programming a value to the SRAM storage element prior to a power-down event. The method further includes, in response to a power-on event at the SRAM storage element after the power-down event, increasing a supply voltage of the SRAM storage element and sensing a state of the SRAM storage element to determine the value programmed to the SRAM storage element prior to the power-down event. In a particular example, an apparatus includes the SRAM storage element and control circuitry coupled to the SRAM storage element. The control circuitry may be configured to program the value to the SRAM storage element, to increase the supply voltage, and to sense the state of the SRAM storage element to determine the value programmed to the SRAM storage element prior to the power-down event.

25 Claims, 4 Drawing Sheets

VOLATILE/NON-VOLATILE SRAM DEVICE

This disclosure is generally related to electronic devices, such as memory devices.

I. DESCRIPTION OF RELATED ART

Electronic devices may include memory devices that store information, such as instructions and data. Examples of memory devices include volatile storage devices, such as static random access memory (SRAM) devices, and non-volatile storage devices, such as resistance-based storage devices or read-only memory (ROM) devices. In some circumstances, an electronic device may load information from a slower non-volatile memory (e.g., from a ROM device) into a faster volatile memory (e.g., into an SRAM device) to enable faster access to the information during device operation.

Volatile storage devices typically lose information upon power down events. For example, an SRAM storage element may include a pair of cross-coupled inverters that store a voltage (representing a high logic value or a low logic value) that is lost when a supply voltage that powers the SRAM storage element is interrupted or disconnected.

To preserve data at a volatile memory device, some devices include a battery or a non-volatile memory device connected to the volatile memory device. However, these techniques may be expensive to implement. For example, an additional mask may be used to fabricate resistance-based storage elements in one or more circuit layers located above an SRAM device. The use of the additional mask incurs additional cost.

II. SUMMARY

A static random access memory (SRAM) device in accordance with the present disclosure may be programmed using a bias voltage to cause the SRAM device to "prefer" a particular state (e.g., based on shifting transistor threshold voltages) even after disconnection of a supply voltage. To illustrate, differences (or "mismatch") between threshold voltages of transistors fabricated using a relatively small process technology (e.g., a 16 nanometer process) may affect operation of the SRAM device, such as by creating a slightly "preferred" state at the SRAM device. Because of the threshold voltage mismatch, the SRAM device may be more easily programmed to a logic "0" state than to a logic "1" state (or vice versa). Thus, the SRAM device may be more susceptible to a logic "0" state than a logic "1" state and thus may "prefer" the logic "0" state (or vice versa). Certain conventional SRAM devices may attempt to avoid or mitigate threshold voltage mismatch (e.g., by attempting to increase physical symmetry of an SRAM device).

In accordance with the present disclosure, threshold voltage mismatch may be increased to create a non-volatile (or "preferred") state at the SRAM device, such as by overdriving the SRAM device with a strong bias voltage to increase susceptibility (or preference) of the SRAM device to a particular state. After application of the strong bias voltage, the state may be retained at the SRAM device after power is interrupted or disconnected from the SRAM device. After a subsequent power-on, the state can be sensed using a sensing operation, such as by increasing (or "ramping") a supply voltage at the SRAM device. Based on the threshold voltage mismatch, ramping the supply voltage may induce the state at the SRAM device based on which state the SRAM device "prefers" after application of the strong bias voltage (e.g., by causing the SRAM device to have a logic "0" state instead of a logic "1" state, or vice versa). Thus, a non-volatile state can be programmed to the SRAM device without cost and complexity associated with batteries or additional circuit layers of non-volatile storage elements.

In a particular example, a method of operation of an SRAM storage element includes programming a value to the SRAM storage element prior to a power-down event. The method further includes, in response to a power-on event at the SRAM storage element after the power-down event, increasing a supply voltage of the SRAM storage element and sensing a state of the SRAM storage element to determine the value programmed to the SRAM storage element prior to the power-down event.

In another particular example, an apparatus includes an SRAM storage element and control circuitry coupled to the SRAM storage element. The control circuitry is configured to program a value to the SRAM storage element prior to a power-down event. The control circuitry is further configured, in response to a power-on event at the SRAM storage element after the power-down event, to increase a supply voltage of the SRAM storage element and to sense a state of the SRAM storage element to determine the value programmed to the SRAM storage element prior to the power-down event.

In another particular example, an apparatus includes means for accessing an SRAM storage element. The apparatus further includes means for programming a value to the SRAM storage element prior to a power-down event, for increasing a supply voltage of the SRAM storage element in response to a power-on event at the SRAM storage element, and for sensing a state of the SRAM storage element after increasing the supply voltage to determine the value programmed to the SRAM storage element prior to the power-down event.

In another particular example, a computer-readable medium stores instructions executable by a processor to initiate or control operations. The operations include accessing a data file that indicates design information corresponding to a semiconductor device. The operations further include fabricating the semiconductor device according to the design information. The semiconductor device includes an SRAM storage element and control circuitry coupled to the SRAM storage element. The control circuitry is configured to program a value to the SRAM storage element prior to a power-down event. The control circuitry is further configured, in response to a power-on event at the SRAM storage element after the power-down event, to increase a supply voltage of the SRAM storage element and to determine the value programmed to the SRAM storage element prior to the power-down event.

One particular advantage provided by at least one of the disclosed embodiments is that a non-volatile state can be programmed to an SRAM device without cost and complexity associated with batteries or additional circuit layers of non-volatile storage elements. Other aspects, advantages, and features of the present disclosure will become apparent after review of the entire application, including the following sections: Brief Description of the Drawings, Detailed Description, and the Claims.

IV. DETAILED DESCRIPTION

Figure 1:
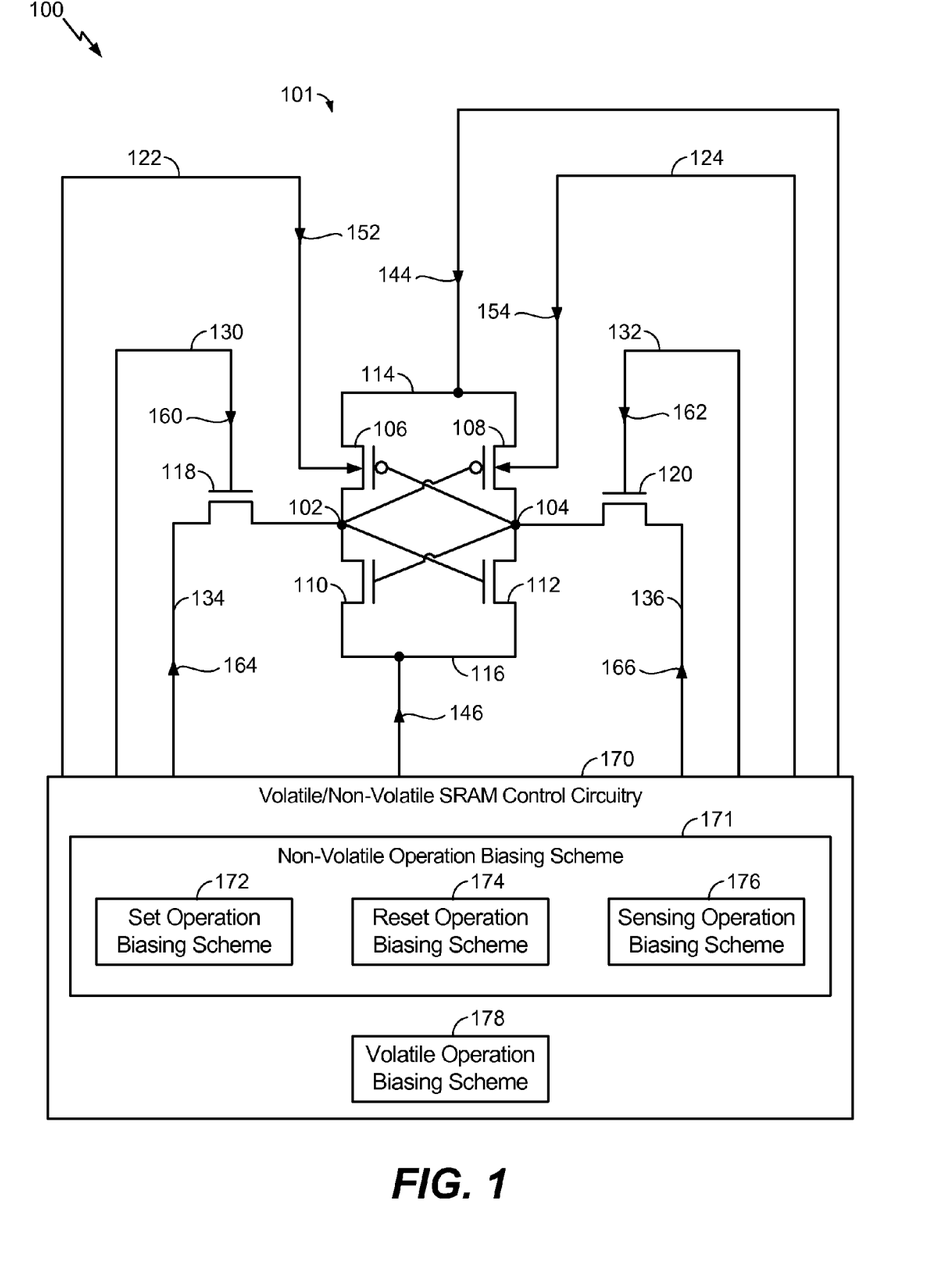
FIG. 1 is a diagram that depicts an illustrative example of a device that includes a static random access memory (SRAM) storage element.

Referring to FIG. 1, a particular illustrative embodiment of a device is depicted and generally designated 100. In a particular implementation, the device 100 is fabricated using a fabrication process of 16 nanometers (nm) or less, such as using a 16 nm complementary metal-oxide-semiconductor (CMOS) fabrication process and/or a 16 nm fin field effect transistor (FinFET) fabrication process.

The device 100 may include a static random access memory (SRAM) storage element 101, which may be implemented within an array of SRAM storage elements, as an illustrative example. The SRAM storage element 101 may include a pair of cross-coupled inverters. For example, in FIG. 1, the SRAM storage element 101 includes a first inverter formed by a p-type metal-oxide-semiconductor field-effect transistor (pMOSFET) 106 (e.g., a first pull-up transistor) coupled to an n-type metal-oxide-semiconductor field-effect transistor (nMOSFET) 110 (e.g., a first pull-down transistor). The SRAM storage element 101 further includes a second inverter formed by a pMOSFET 108 (e.g., a second pull-up transistor) coupled to an nMOSFET 112 (e.g., a second pull-down transistor).

The pMOSFET 106 and the nMOSFET 110 may be coupled via a node 102. For example, drain terminals of the pMOSFET 106 and the nMOSFET 110 may be coupled to the node 102. The pMOSFET 108 and the nMOSFET 112 may be coupled via a node 104. For example, drain terminals of the pMOSFET 108 and the nMOSFET 112 may be coupled to the node 104.

The pMOSFETs 106, 108 may be coupled via a node 114. For example, source terminals of the pMOSFETs 106, 108 may be coupled to the node 114. The nMOSFETs 110, 112 may be coupled via a node 116. For example, source terminals of the nMOSFETs 110, 112 may be coupled to the node 116. The pMOSFET 106 may include a body terminal coupled to a node 122, and the pMOSFET 108 may include a body terminal coupled to a node 124.

The SRAM storage element 101 may further include one or more access transistors. For example, the device 100 includes an access transistor 118 and an access transistor 120. In the example of FIG. 1, the SRAM storage element 101 has a six-transistor (6T) configuration. According to further embodiments, the SRAM storage element 101 may be of a different configuration than the example of FIG. 1 (e.g., a storage element may include a different number of transistors than illustrated in the example of FIG. 1, such as more transistors than the example of FIG. 1 or fewer transistors than the example of FIG. 1).

The device 100 further includes a word line 130, a word line 132, a bit line 134, and a bit line 136. The access transistor 118 is coupled to the word line 130 and to the bit line 134. The access transistor 120 is coupled to the word line 132 and to the bit line 136.

The device 100 further includes control circuitry, such as volatile/non-volatile SRAM control circuitry 170. The volatile/non-volatile SRAM control circuitry 170 may be coupled to the nodes 114, 116, 122, 124, to the word lines 130, 132, and to the bit lines 134, 136. The volatile/non-volatile SRAM control circuitry 170 may be configured to generate bias voltages 144, 146, 152, 154, 160, 162, 164, and 166 during operation of the device 100. For example, the bias voltage 144 may be a supply voltage (e.g., VDD) that is provided to the SRAM storage element 101 by the volatile/non-volatile SRAM control circuitry 170. As another example, the bias voltage 146 may be a ground or reference voltage (e.g., VSS) that is provided to the SRAM storage element 101 by the volatile/non-volatile SRAM control circuitry 170.

In a particular embodiment, an SRAM device includes a first set of SRAM storage elements (e.g., a first sub-array) and a second set of SRAM storage elements (e.g., a second sub-array). The first set of SRAM storage elements may function as volatile storage, and the second set of SRAM storage elements may function as non-volatile storage (e.g., rewritable non-volatile storage or non-rewritable non-volatile storage). Depending on the particular implementation and mode of operation, the SRAM storage element 101 may function as a volatile storage element and/or as a non-volatile storage element. For example, the SRAM storage element 101 may be adjustable from a volatile storage mode to a non-volatile storage mode (and vice versa).

During operation of the device 100, the volatile/non-volatile SRAM control circuitry 170 may bias the SRAM storage element 101 based on a particular mode of operation. For example, the volatile/non-volatile SRAM control circuitry 170 may bias the SRAM storage element 101 based on a non-volatile mode of operation or a volatile (or "nominal") mode of operation. During the non-volatile mode of operation, the volatile/non-volatile SRAM control circuitry 170 may apply a non-volatile operation biasing scheme 171, which may include a first biasing scheme (e.g., a set operation biasing scheme 172), a second biasing scheme (e.g., a reset operation biasing scheme 174), and a third biasing scheme (e.g., a sensing operation biasing scheme 176). During the volatile mode of operation, the volatile/non-volatile SRAM control circuitry 170 may apply a volatile operation biasing scheme 178 to the SRAM storage element 101.

A set operation may be initiated using the set operation biasing scheme 172 to set a first state of the device 100. Setting the first state may cause the device 100 to have a susceptibility (or "preference") for a first value (e.g., a logic "0" value). The first value is non-volatile and can be sensed (e.g., upon power-on of an electronic device that includes the device 100). To set the first state, bias voltages may be selectively applied to the device 100 to "overdrive" one or more transistor gate terminals to create or increase a "mismatch" between threshold voltages of transistors of the device 100 (e.g., by causing a physical change to transistor gate oxide regions and/or by trapping electrons in the transistor gate oxide regions). For example, values of the bias voltages 144, 146, 152, 154, 160, 162, 164, and 166 may be selected to create or increase a threshold voltage mismatch. To further illustrate, Table 1 illustrates example parameters that may be associated with the set operation biasing scheme 172. It should be appreciated that the particular values of bias voltages may depend on the particular application (e.g., based on the particular fabrication process, device materials, configuration, and operating temperature range, as illustrative examples).

TABLE 1

| Signal | Polarity/voltage (V) |
|---|---|
| Bias voltage 144 | Positive (e.g., +1 V) |
| Bias voltage 146 | Negative (e.g., −1 V) |
| Bias voltage 152 | Positive (e.g., +1 V) |
| Bias voltage 154 | 0 V |
| Bias voltage 160 | Positive (e.g., +1.5 V) |
| Bias voltage 162 | 0 V |
| Bias voltage 164 | Positive (e.g., +1 V) |
| Bias voltage 166 | Negative (e.g., −1 V) |
| Voltage at node 102 | Positive (e.g., +1 V) |
| Voltage at node 104 | Negative (e.g., −1 V) |

In the example biasing scheme of Table 1, the bias voltages 152, 160, and 164 may correspond to "strong" bias voltages. For example, in an implementation in which a supply voltage (VDD) is approximately 0.85 V, the bias voltages 152, 160, and 164 exceed the supply voltage. In alternative implementations, a strong bias voltage may be greater than 1 V or 1.5 V (e.g., 2 V or 3 V, as illustrative examples).

Under certain bias conditions (such as the example biasing scheme of Table 1), a set operation at the device 100 may create or increase a mismatch between the first inverter formed by the pMOSFET 106 and the nMOSFET 110 and the second inverter formed by the pMOSFET 108 and the nMOSFET 112. To illustrate, a set operation performed using the example biasing scheme of Table 1 may increase the threshold voltage of the pMOSFET 106 (e.g., by approximately 50 mV), may decrease the threshold voltage of the nMOSFET 110 (e.g., by approximately 50 mV), may decrease the threshold voltage of the pMOSFET 108 (e.g., by approximately 50 mV), and may increase the threshold voltage of the nMOSFET 112 (e.g., by approximately 50 mV). In this case, after programming based on the set operation biasing scheme 172, the device 100 may "prefer" the first value (e.g., a logic "0" value).

A reset operation may be initiated using the reset operation biasing scheme 174 to set a second state of the device 100, which may cause the device 100 to have a susceptibility (or "preference") for a second value (e.g., a logic "1" value). The second value can be sensed (e.g., upon power-on of an electronic device that includes the device 100). To set the second state, bias voltages may be selectively applied to the device 100 to "overdrive" one or more transistor gate terminals to create or increase a "mismatch" between threshold voltages of transistors of the device 100 (e.g., by causing a physical change to transistor gate oxide regions and/or by trapping electrons in the transistor gate oxide regions). For example, values of bias voltages 144, 146, 152, 154, 160, 162, 164, and 166 may be selected to create or increase a threshold voltage mismatch. To further illustrate, Table 2 illustrates example parameters that may be associated with the reset operation biasing scheme 174. It should be appreciated that the particular values of bias voltages may depend on the particular application (e.g., based on the particular fabrication process, device materials, configuration, and operating temperature range, as illustrative examples).

TABLE 2

| Signal | Polarity/voltage (V) |
|---|---|
| Bias voltage 144 | Positive (e.g., +1 V) |
| Bias voltage 146 | Negative (e.g., −1 V) |
| Bias voltage 152 | 0 V |
| Bias voltage 154 | Positive (e.g., +1 V) |
| Bias voltage 160 | 0 V |
| Bias voltage 162 | Positive (e.g., +1.5 V) |
| Bias voltage 164 | Negative (e.g., −1 V) |
| Bias voltage 166 | Positive (e.g., +1 V) |
| Voltage at node 102 | Negative (e.g., −1 V) |
| Voltage at node 104 | Positive (e.g., +1 V) |

In the example biasing scheme of Table 2, the bias voltages 154, 162, and 166 may correspond to "strong" bias voltages. For example, in an implementation in which a supply voltage (VDD) is approximately 0.8 V, the bias voltages 154, 162, and 166 exceed the supply voltage. In alternative implementations, a strong bias voltage may be greater than 1 V or 1.5 V (e.g., 2 V or 3 V, as illustrative examples).

Under certain bias conditions (such as the example biasing scheme of Table 2), a reset operation at the device 100 may create or increase a mismatch between the first inverter formed by the pMOSFET 106 and the nMOSFET 110 and the second inverter formed by the pMOSFET 108 and the nMOSFET 112. To illustrate, a reset operation performed using the example biasing scheme of Table 2 may decrease the threshold voltage of the pMOSFET 106 (e.g., by approximately 50 mV), may increase the threshold voltage of the nMOSFET 110 (e.g., by approximately 50 millivolts (mV)), may increase the threshold voltage of the pMOSFET 108 (e.g., by approximately 50 mV), and may decrease the threshold voltage of the nMOSFET 112 (e.g., by approximately 50 mV). In this case, the device 100 may "prefer" the second value (e.g., a logic "1" value).

The set operation and the reset operation may be performed using pulsed signals of a relatively short duration to avoid damage to the SRAM storage element 101 (e.g., to avoid damage to gate dielectric regions of transistors of the SRAM storage element 101). In a particular embodiment, the set operation biasing scheme 172 and the reset operation biasing scheme 174 may be applied for approximately 10 milliseconds (ms) or less (e.g., approximately 1 ms, as an illustrative example). In this example, the volatile/non-volatile SRAM control circuitry 170 may include one or more pulse generator circuits configured to generate one or more pulses having a particular voltage (or pulse "height") and/or a particular duration (or pulse "width").

By using a set operation or a reset operation to write a value (e.g., a logic "0" value or a logic "1" value) to the device 100, a "preferred" state can be created that can be sensed using a sense operation. The preferred state may be used to store non-volatile information at an electronic device that includes the device 100. For example, after writing the value to the device 100, a power down event may occur at the electronic device. Upon power-up at the electronic device, a sensing operation may be performed to sense the value (e.g., to determine whether a logic "0" or a logic "1" was written to the device 100 prior to the power-down event) using the sensing operation biasing scheme 176.

In connection with the sensing operation biasing scheme 176, the sensing operation may include setting the bias voltages 160, 162 to a low voltage (e.g., 0 V), which may deactivate the access transistors 118, 120. The bias voltages 146, 152, and 154 may also be set to a low voltage (e.g., 0 V) during the sensing operation, and the bias voltages 164, 166 may be removed (e.g., to cause the bit lines 134, 136 to "float"). The bias voltage 144 may be gradually increased (or "ramped") during the sensing operation. As an illustrative example, the bias voltage 144 may be ramped from a ground potential (e.g., 0 V) to a supply voltage level (e.g., 0.85 V) during a particular time duration (e.g., 100 ms, as an illustrative example) while the access transistors 118, 120 are deactivated. Based on the preferred state of the device 100, one of the nodes 102, 104 may be pulled up to the supply voltage prior to the other of the nodes 102, 104 to "restore" the value written to the device 100 prior to the power-down event.

After increasing the bias voltage 144 to "restore" the value, the access transistors 118, 120 may be activated to enable sensing of the value. For example, the bias voltages 160, 162 may be increased to the supply voltage level (e.g., 0.85 V). Based on the value stored by the device 100 (e.g., a logic "0" value or a logic "1" value), one of the bit lines 134, 136 may be activated (e.g., may have a logic "1" value), which indicates the value written to the device 100 prior to the power-down event.

Depending on the particular implementation, the SRAM storage element 101 may function as a rewritable storage element (i.e., a multiple-time programmable storage element) or as a non-rewritable storage element (i.e., a single-time programmable storage element), such as a read-only memory (ROM) storage element or a one-time programmable (OTP) storage element. In a non-rewritable implementation, one or more biasing schemes illustrated in FIG. 1 may be omitted (e.g., the set operation biasing scheme 172 and/or the reset operation biasing scheme 174 may be omitted).

In a rewritable implementation, non-volatile SRAM storage elements may be associated with a particular cycling endurance. As an illustrative example, non-volatile SRAM storage elements may have a cycling endurance of approximately 100 to 300 set/reset operation cycles. In this example, non-volatile data storage reliability of the non-volatile SRAM storage elements may be reduced below a reliability threshold after 100 to 300 set/reset operation cycles. In a particular embodiment, the volatile/non-volatile SRAM control circuitry 170 may include one or more counters that track (or approximate) a number of set/reset operations cycles. When a value of the counter satisfies the reliability threshold, the volatile/non-volatile SRAM control circuitry 170 may reconfigure the non-volatile SRAM storage elements as volatile SRAM storage elements (e.g., by adjusting operation of the SRAM storage element 101 from the non-volatile operation biasing scheme 171 to the volatile operation biasing scheme 178).

In some implementations, one or more processes may be applied during fabrication to non-volatile SRAM storage elements to improve state retention at the non-volatile SRAM storage elements. As an illustrative example, a high-temperature retention process may be performed to increase state retention after application of a strong gate bias, such by using a 15-hour 125 degrees Celsius (° C.) baking process. In this example, the high-temperature retention process may "bake" characteristics into SRAM storage elements, such as by temporarily "hardening" transistor gate oxide regions and by "freezing" electrons in the transistor gate oxide regions. In some cases, a high-temperature retention process may be "reversed" by application of a strong reverse gate bias (e.g., to free electrons trapped in the transistor gate oxide regions). Thus, during fabrication of the device 100, one or more processes may be applied to the device 100 to change operating characteristics of the SRAM storage element 101, such as by changing threshold voltages of transistors of the SRAM storage element 101 (and/or by increasing threshold voltage "mismatch" associated with transistors of the SRAM storage element 101).

The example set operation, reset operation, and sensing operation described with reference to FIG. 1 illustrate that values can be stored at the device 100 in a non-volatile manner. Advantageously, the values can be stored in a non-volatile manner without use of a battery and without use of an external (or "backup") memory, which may reduce cost and complexity of an electronic device. For example, one or more fabrication masks used to create a layer of non-volatile storage elements may be avoided, thus decreasing fabrication cost of an electronic device. Further, fabrication cost can be reduced by manufacturing volatile and non-volatile SRAM storage elements using the same fabrication process. For example, the volatile and non-volatile SRAM storage elements may have common physical structures that can be fabricated using common fabrication processes (instead of using separate fabrication processes for volatile and non-volatile storage devices).

In some cases, the device 100 may function as volatile storage in connection with a volatile mode of operation associated with the volatile operation biasing scheme 178. In some implementations, to switch from the non-volatile mode of operation to the volatile mode of operation, a reverse gate bias may be applied to one or more transistors of the device 100 to "reverse" the change in threshold voltage caused by application of a strong gate bias (e.g., to reduce threshold voltage mismatch of the transistors to "reverse" preference for a particular value at the device 100). For example, one of the bias voltages 164, 166 may be applied (while one of the access transistors 118, 120 is activated via one of the bias voltages 160, 162) to write a logic "0" value or a logic "1" value to the device 100. To sense the value, the access transistors 118, 120 may be activated via the bias voltages 160, 162 while the bit lines 134, 136 "float." Thus, the device 100 may function as volatile and non-volatile storage. Use of the device 100 for volatile storage (e.g., during a first operating mode of the SRAM storage element 101) and for non-volatile storage (e.g., during a second operating mode of the SRAM storage element 101) may reduce cost and complexity of an electronic device (e.g., by enabling use of a single memory for both volatile and non-volatile storage). Depending on the particular application, operating modes of the device 100 (e.g., volatile or non-volatile) can be determined by a processor, controller, host, or other device that is coupled to the device 100 (not shown in FIG. 1).

Figure 2:
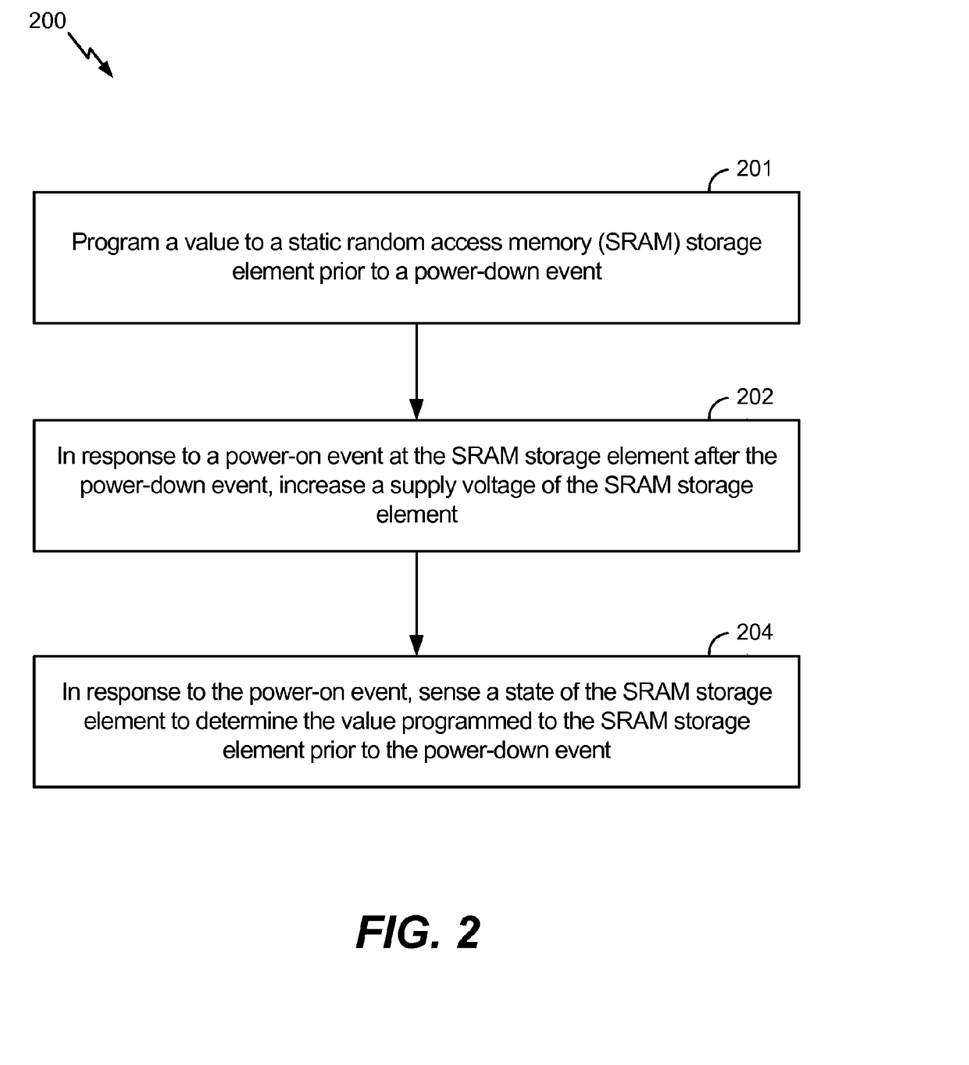
FIG. 2 is a flow diagram that depicts an illustrative method of operation an SRAM storage element, such as the SRAM storage element of FIG. 1.

Referring to FIG. 2, an illustrative method of operation of a static random access memory (SRAM) storage element is depicted and generally designated 200. The SRAM storage element may correspond to the SRAM storage element 101, as an illustrative example. The method 200 illustrated in FIG. 2 may correspond to the sensing operation described with reference to FIG. 1. One or more operations of the method 200 may be performed, initiated, or controlled by the volatile/non-volatile SRAM control circuitry 170 of FIG. 1.

The method 200 includes programming a value to the SRAM storage element prior to a power-down event, at 201. As an example, the value may be a logic "0" value that is programmed to the SRAM storage element in connection with a set operation performed using the set operation biasing scheme 172. As another example, the value may be a logic "1" value that is programmed to the SRAM storage element in connection with a reset operation performed using the reset operation biasing scheme 174.

The method 200 further includes increasing a supply voltage of the SRAM storage element in response to a power-on event at the SRAM storage element after the power-down event, at 202. For example, the supply voltage may correspond to the bias voltage 144, and the volatile/non-volatile SRAM control circuitry 170 may apply the bias voltage 144 to the node 114 in response to the power-on event. In a particular embodiment, the volatile/non-volatile SRAM control circuitry 170 is configured to gradually increase (or "ramp") the supply voltage from a low voltage level to a supply voltage level, such as by increasing the bias voltage 144 from a ground or reference voltage level (VSS) to a supply voltage level (VDD).

The method 200 further includes, in response to the power-on event, sensing a state of the SRAM storage element to determine the value programmed to the SRAM storage element prior to the power-down event, at 204. For example, after applying the bias voltage 144 to the node 114, the volatile/non-volatile SRAM control circuitry 170 may apply the bias voltages 160, 162 to the word lines 130, 132 to activate the access transistors 118, 120. After activating the access transistors 118, 120, the volatile/non-volatile SRAM control circuitry 170 may determine which of the bit lines 134, 136 is activated (e.g., by detecting a voltage (or current) of a bit line coupled to the SRAM storage element 101, such as by determining which one of the bit lines 134, 136 has a higher voltage (or current) than the other of the bit lines 134, 136).

To further illustrate, the state may correspond to a susceptibility of the SRAM storage element 101 to the value (e.g., a "preference" for the value). The susceptibility may be created (prior to a power-down event that precedes the power-on event) by increasing a threshold voltage difference between transistors of the SRAM storage element 101. For example, increasing the threshold voltage difference may include biasing a first body terminal of a first transistor (e.g., the pMOSFET 106) of the SRAM storage element 101 with a first bias voltage (e.g., the bias voltage 152) and/or biasing a second body terminal of a second transistor (e.g., the pMOSFET 108) of the SRAM storage element with a second bias voltage (e.g., the bias voltage 154) that is different than the first bias voltage. In at least one example, the first bias voltage is a positive voltage, and the second bias voltage is a ground voltage. For example, Table 1 illustrates that for a set operation, the bias voltage 152 may be a positive voltage, and the bias voltage 154 may be a ground voltage. In another example, the first bias voltage is a ground voltage, and the second bias voltage is a positive voltage. For example, Table 2 illustrates that for a reset operation, the bias voltage 152 may be a ground voltage, and the bias voltage 154 may be a positive voltage. Thus, the susceptibility may correspond to either a first logic value associated with a set operation (e.g., a logic one value) or a second logic value associated with a reset operation (e.g., a logic zero value).

The method 200 illustrates that information can be stored in a non-volatile manner at an SRAM storage element without use of a battery or a separate non-volatile memory device. For example, a value (a non-volatile logic value) can be written to an SRAM storage element by creating a susceptibility to a state that indicates the value. To recover the value after a power cycle (power-down and power-on), a supply voltage can be increased to induce the state at the SRAM storage element, and the state can be sensed to determine the value. Accordingly, cost and complexity of an electronic device may be reduced, such as by avoiding use of additional integrated circuit layers and/or an additional fabrication mask associated with a separate non-volatile memory device.

One or more operations of the method 200 may be initiated, controlled, or performed by a hardware device, such as a processing unit. For example, depending on the particular implementation, the volatile/non-volatile SRAM control circuitry 170 may include a field-programmable gate array (FPGA) device, an application-specific integrated circuit (ASIC), a processing unit such as a central processing unit (CPU), a digital signal processor (DSP), a controller, another hardware device, a firmware device, or a combination thereof.

Figure 3:
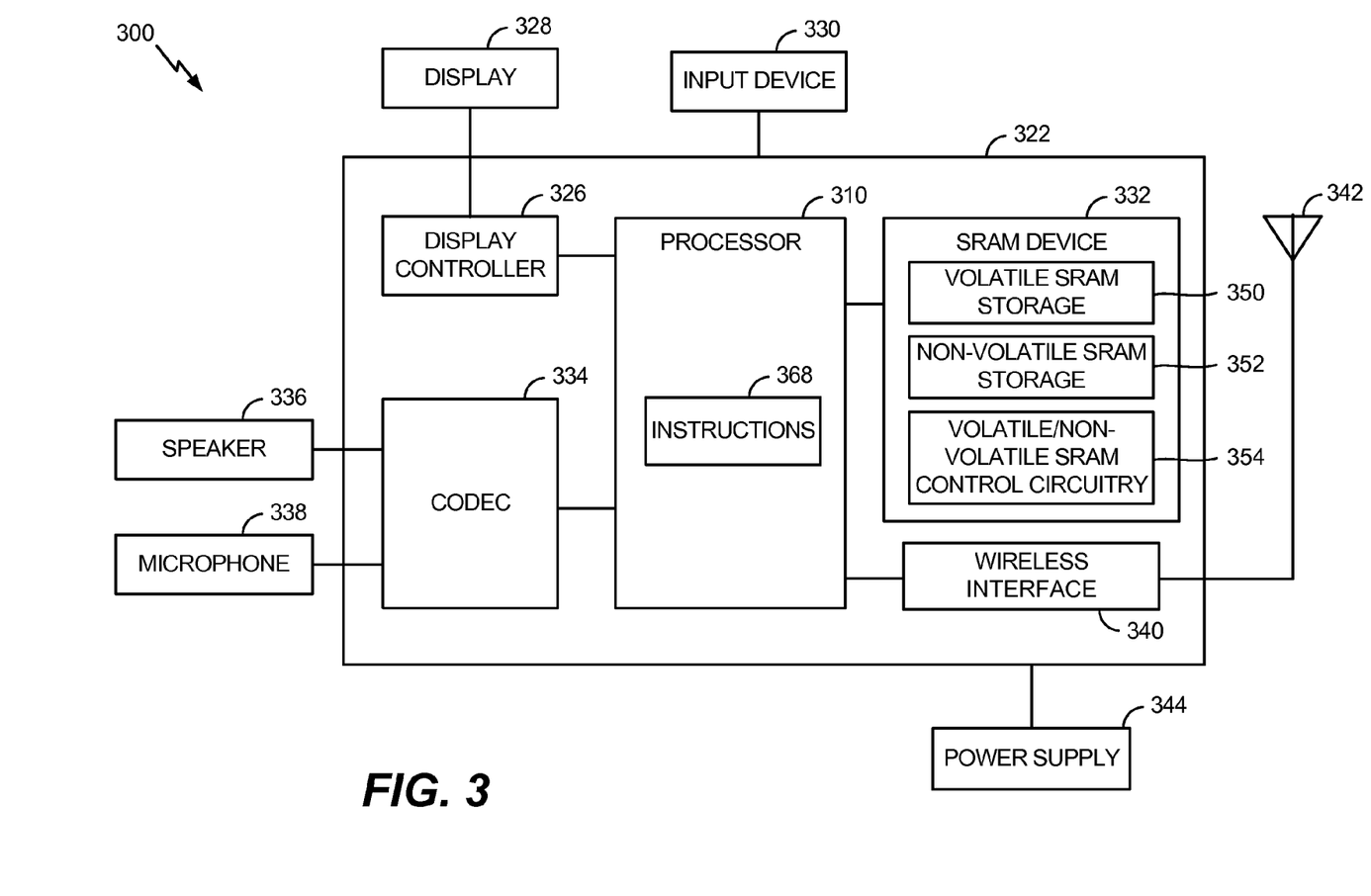
FIG. 3 is a block diagram of an illustrative example of an electronic device including an SRAM storage element, such as the SRAM storage element of FIG. 1.

Referring to FIG. 3, a block diagram of a particular illustrative embodiment of an electronic device is depicted and generally designated 300. The electronic device 300 may correspond to a mobile device (e.g., a cellular telephone), a computer (e.g., a laptop computer, a tablet computer, or a desktop computer), a set top box, an entertainment unit, a navigation device, a personal digital assistant (PDA), a television, a tuner, a radio (e.g., a satellite radio), a music player (e.g., a digital music player and/or a portable music player), a video player (e.g., a digital video player, such as a digital video disc (DVD) player and/or a portable digital video player), another electronic device, or a combination thereof.

The electronic device 300 includes a processor 310, such as a digital signal processor (DSP), a central processing unit (CPU), and/or a graphics processing unit (GPU), as illustrative examples. The processor 310 may execute instructions 368.

The electronic device 300 may further include one or more memory devices, such a static random access memory (SRAM) device 332. The SRAM device 332 is coupled to the processor 310. The SRAM device 332 includes volatile SRAM storage 350, non-volatile SRAM storage 352, and volatile/non-volatile SRAM control circuitry 354. The SRAM device 332 may include the device 100 of FIG. 1. For example, the volatile/non-volatile SRAM control circuitry 354 may correspond to the volatile/non-volatile SRAM control circuitry 170 of FIG. 1.

Depending on the particular configuration and operating mode of the SRAM device 332, the SRAM storage element 101 of FIG. 1 may function as volatile or non-volatile storage. For example, in a first configuration, the SRAM storage element 101 may be integrated within the non-volatile SRAM storage 352 and may function as non-volatile storage. In a second configuration, the SRAM storage element 101 may be integrated within the volatile SRAM storage 350 and may function as volatile storage.

In some implementations, the processor 310 may be operable to adjust the configuration of the SRAM device 332, such as by issuing commands to the volatile/non-volatile SRAM control circuitry 354 to "re-assign" one or more SRAM storage elements of the non-volatile SRAM storage 352 to the volatile SRAM storage 350 (or vice versa). The commands may specify either the non-volatile operation biasing scheme 171 (for non-volatile operation) or the volatile operation biasing scheme 178 (for volatile operation). To illustrate, if an available storage size of the volatile SRAM storage 350 fails to satisfy a storage size threshold, then the processor 310 may "re-assign" one or more SRAM storage elements from the non-volatile SRAM storage 352 to the volatile SRAM storage 350 (e.g., to improve device performance by increasing volatile storage, which may function as a high-speed cache). In another example, if an available storage size of the non-volatile SRAM storage 352 fails to satisfy a storage size threshold, then the processor 310 may "re-assign" one or more SRAM storage elements from the volatile SRAM storage 350 to the non-volatile SRAM storage 352 (e.g., in response to initiation of a power-down event at the electronic device 300 in order to enable transfer of data from the volatile SRAM storage 350 to the non-volatile SRAM storage 352). Thus, configuration (e.g., storage size) of the volatile SRAM storage 350 and the non-volatile SRAM storage 352 may be adjusted (e.g., by the processor 310) during operation of the electronic device 300.

FIG. 3 also shows a display controller 326 that is coupled to the processor 310 and to a display 328. A coder/decoder (CODEC) 334 can also be coupled to the processor 310. A speaker 336 and a microphone 338 can be coupled to the CODEC 334. FIG. 3 also indicates that a wireless interface 340, such as a wireless controller and/or a transceiver, can be coupled to the processor 310 and to an antenna 342.

In a particular embodiment, the processor 310, the display controller 326, the SRAM device 332, the CODEC 334, and the wireless interface 340 are included in a system-in-package or system-on-chip device 322. Further, an input device 330 and a power supply 344 may be coupled to the system-on-chip device 322. Moreover, in a particular embodiment, as illustrated in FIG. 3, the display 328, the input device 330, the speaker 336, the microphone 338, the antenna 342, and the power supply 344 are external to the system-on-chip device 322. However, each of the display 328, the input device 330, the speaker 336, the microphone 338, the antenna 342, and the power supply 344 can be coupled to a component of the system-on-chip device 322, such as to an interface or to a controller.

In connection with the described embodiments, an apparatus includes an SRAM storage element (e.g., the SRAM storage element 101) and control circuitry (e.g., any of the volatile/non-volatile SRAM control circuits 170, 354) coupled to the SRAM storage element. The control circuitry is configured to program a value (e.g., a logic "1" value or a logic "0" value) to the SRAM storage element prior to a power-down event. The control circuitry is further configured, in response to a power-on event at the SRAM storage element after the power-down event, to increase a supply voltage (e.g., the bias voltage 144) of the SRAM storage element and to sense a state (e.g., a higher voltage at node 102 than at the node 104, or vice versa) of the SRAM storage element to determine the value programmed to the SRAM storage element prior to the power-down event.

In another particular example, an apparatus includes means (e.g., any of the word lines 130, 132 or the bit lines 134, 136) for accessing an SRAM storage element (e.g., the SRAM storage element 101). The apparatus further includes means (e.g., any of the volatile/non-volatile SRAM control circuits 170, 354) for programming a value (e.g., a logic "1" value or a logic "0" value) to the SRAM storage element prior to a power-down event, for increasing a supply voltage (e.g., the bias voltage 144) of the SRAM storage element in response to a power-on event at the SRAM storage element after the power-down event, and for sensing a state (e.g., a higher voltage at node 102 than at the node 104, or vice versa) of the SRAM storage element after increasing the supply voltage to determine the value programmed to the SRAM storage element prior to the power-down event.

Figure 4:
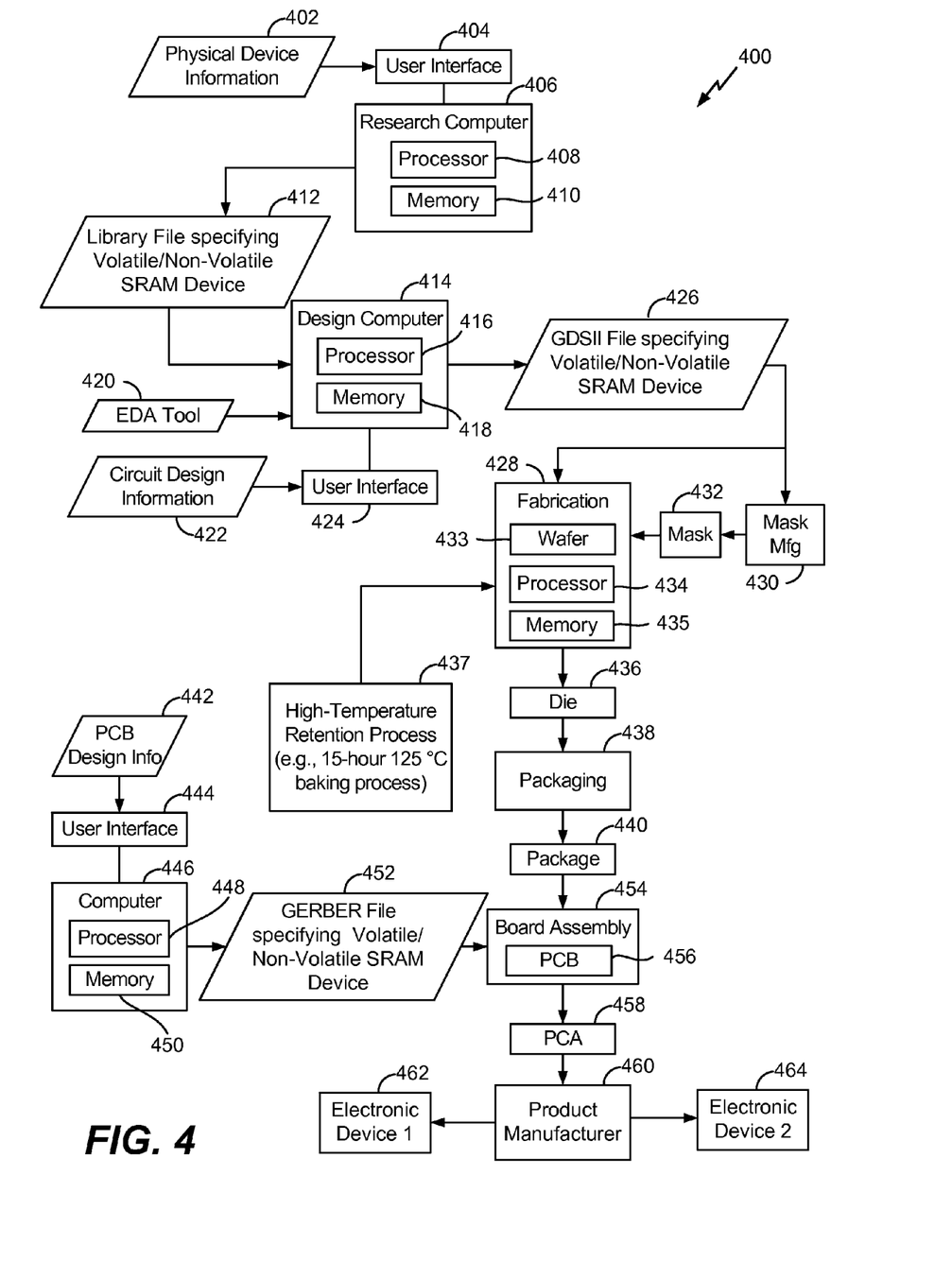
FIG. 4 is a data flow diagram of a particular illustrative embodiment of a manufacturing process to manufacture an electronic device that includes an SRAM storage element, such as the SRAM storage element of FIG. 1.

The foregoing disclosed devices and functionalities may be designed and represented using computer files (e.g. RTL, GDSII, GERBER, etc.). The computer files may be stored on computer-readable media. Some or all such files may be provided to fabrication handlers who fabricate devices based on such files. Resulting products include wafers that are then cut into die and packaged into integrated circuits (or "chips"). The chips are then employed in electronic devices, such as the electronic device 300 of FIG. 3. FIG. 4 depicts a particular illustrative embodiment of an electronic device manufacturing process 400.

Referring to FIG. 4, the electronic device manufacturing process 400 may include receiving physical device information 402, such as at a research computer 406. The physical device information 402 may include design information representing at least one physical property of a device, such as the device 100 of FIG. 1 and/or the SRAM device 332 of FIG. 3. For example, the physical device information 402 may include physical parameters, material characteristics, and structure information that is entered via a user interface 404 coupled to the research computer 406. The research computer 406 includes a processor 408, such as one or more processing cores. The processor 408 is coupled to a computer-readable medium, such as a memory 410. The memory 410 may store computer-readable instructions that are executable by the processor 408 to transform the physical device information 402 to comply with a file format and to generate a library file 412.

The library file 412 may include at least one data file including the transformed design information. For example, the library file 412 may specify a library of devices that includes the device 100 of FIG. 1 and/or the SRAM device 332 of FIG. 3.

The library file 412 may be used in conjunction with an electronic design automation (EDA) tool 420 at a design computer 414. The design computer 414 includes a processor 416, such as one or more processing cores. The processor 416 is coupled to a memory 418. The EDA tool 420 may include processor executable instructions stored at the memory 418 to enable a user of the design computer 414 to design a circuit that includes the device 100 of FIG. 1 and/or the SRAM device 332 of FIG. 3. For example, a user of the design computer 414 may enter circuit design information 422 via a user interface 424 coupled to the design computer 414. The circuit design information 422 may include design information representing at least one physical property of a device, such as the device 100 of FIG. 1 and/or the SRAM device 332 of FIG. 3. To illustrate, the circuit design property may include identification of particular circuits and relationships to other elements in a circuit design, positioning information, feature size information, interconnection information, or other information representing a physical property of a device, such as the device 100 of FIG. 1 and/or the SRAM device 332 of FIG. 3.

The design computer 414 may be configured to transform the circuit design information 422 to comply with a file format. To illustrate, the file format may include a database binary file format representing planar geometric shapes, text labels, and other information about a circuit layout in a hierarchical format, such as a Graphic Data System (GDSII) file format. The design computer 414 may be configured to generate a data file including the transformed design information, such as a GDSII file 426 that includes information describing the device 100 of FIG. 1 and/or the SRAM device 332 of FIG. 3.

The GDSII file 426 may be received at a fabrication process 428. The fabrication process 428 may fabricate the device 100 of FIG. 1 and/or the SRAM device 332 of FIG. 3 based on the GDSII file 426. In a particular embodiment, the fabrication process 428 is associated with a half-pitch of 16 nm or less. For example, the fabrication process 428 may include a 16 nm CMOS fabrication process and/or a 16 nm FinFET fabrication process.

The GDSII file 426 may be provided to a mask manufacturer 430 to create one or more masks, such as masks to be used with photolithography processing, illustrated in FIG. 4 as a representative mask 432. The mask 432 may be used during the fabrication process 428 to generate one or more wafers 433, which may be tested and separated into dies, such as a representative die 436. The die 436 may include the device 100 of FIG. 1 and/or the SRAM device 332 of FIG. 3. In a particular embodiment, the fabrication process 428 includes performing a high temperature retention process 437. For example, the high temperature retention process 437 may include a 15-hour 125 degrees Celsius (° C.) baking process.

Operations of the fabrication process 428 may be initiated or controlled using a processor 434 and a memory 435. The memory 435 may store instructions that are executable by the processor 434.

The fabrication process 428 may be implemented by a fabrication system that is fully automated or partially automated. For example, the fabrication process 428 may be automated according to a schedule. The fabrication system may include fabrication equipment (e.g., processing tools) to perform one or more operations to form a device. For example, the fabrication equipment may be configured to deposit one or more materials, epitaxially grow one or more materials, conformally deposit one or more materials, apply a hardmask, apply an etching mask, perform etching, perform planarization, form a gate stack (e.g., using a metal gate process), perform a shallow trench isolation (STI) process, and/or perform a standard clean 1 process, as illustrative examples.

The fabrication system may have a distributed architecture (e.g., a hierarchy). For example, the fabrication system may include one or more processors, such as the processor 434, one or more memories, such as the memory 435, and/or one or more controllers that are distributed according to the distributed architecture. The distributed architecture may include a high-level processor that controls or initiates operations of one or more low-level systems. For example, a high-level portion of the fabrication process 428 may be initiated or controlled by one or more processors, such as the processor 434, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the high-level processor. Each of the one or more low-level systems may be associated with one or more corresponding pieces of fabrication equipment, such as one or more processing tools. Example processing tools include doping or deposition tools (e.g., a molecular beam epitaxial growth tool, a flowable chemical vapor deposition (FCVD) tool, a conformal deposition tool, or a spin-on deposition tool) and removal tools (e.g., a chemical removal tool, a reactive gas removal tool, a hydrogen reaction removal tool, or a standard clean 1 removal tool).

In a particular embodiment, the fabrication system may include multiple processors that are distributed in the fabrication system. For example, a controller of a low-level system component may include a processor, such as the processor 434. Alternatively, the processor 434 may be a part of a high-level system, subsystem, or component of the fabrication system. In another embodiment, the processor 434 includes distributed processing at various levels and components of a fabrication system.

In connection with the described embodiments, a computer-readable medium (e.g., the memory 435) stores instructions that are executable by a processor (e.g., the processor 434) to initiate or control operations (e.g., operations of the fabrication process 428). The operations include accessing a data file (e.g., the GDSII file 426) that indicates design information corresponding to a semiconductor device (e.g., the device 100 and/or the SRAM device 332). The operations further include fabricating the semiconductor device according to the design information (e.g., using the fabrication process 428). The semiconductor device includes an SRAM storage element (e.g., the SRAM storage element 101) and control circuitry (e.g., any of the volatile/non-volatile SRAM control circuitries 170, 354) coupled to the SRAM storage element. The control circuitry is configured to program a value (e.g., a logic "1" value or a logic "0" value) to the SRAM storage element prior to a power-down event. The control circuitry is further configured, in response to a power-on event at the SRAM storage element after the power-down event, to increase a supply voltage (e.g., the bias voltage 144) of the SRAM storage element and to sense a state (e.g., a higher voltage at node 102 than at the node 104, or vice versa) of the SRAM storage element to determine the value programmed to the SRAM storage element prior to the power-down event. In a particular embodiment, the operations further include performing a high temperature retention process on the SRAM storage element, such as the high temperature retention process 437, which may include a 15-hour 125° C. baking process. The high temperature retention process may change a threshold voltage of one or more transistors (e.g., any of the pMOSFETs 106, 108 and/or any of the nMOSFETs 110, 112) of the SRAM storage element. In a particular embodiment, the semiconductor device is fabricated using a fabrication process associated with a half-pitch of 16 nm or less (e.g., a 16 nm CMOS fabrication process and/or a 16 nm FinFET fabrication process)

The die 436 may be provided to a packaging process 438. The packaging process 438 may incorporate the die 436 into a representative package 440. The package 440 may include a single die (such as the die 436) or multiple dies, such as in connection with a system-in-package (SiP) arrangement. The package 440 may be configured to conform to one or more standards or specifications, such as one or more Joint Electron Device Engineering Council (JEDEC) standards.

Information regarding the package 440 may be distributed to various product designers, such as using a component library stored at a computer 446. The computer 446 may include a processor 448, such as one or more processing cores, coupled to a memory 450. A printed circuit board (PCB) tool may be stored as processor executable instructions at the memory 450 to process PCB design information 442 received from a user of the computer 446 via a user interface 444. The PCB design information 442 may include physical positioning information of a packaged device on a circuit board. The packaged device may include the device 100 of FIG. 1 and/or the SRAM device 332 of FIG. 3.

The computer 446 may be configured to transform the PCB design information 442 to generate a data file, such as a GERBER file 452. The GERBER file 452 may indicate physical positioning information of a packaged device on a circuit board, as well as layout of electrical connections, such as traces and vias. The packaged device may include the device 100 of FIG. 1 and/or the SRAM device 332 of FIG. 3. In other embodiments, the data file generated by transforming PCB design information 442 may have a format other than a GERBER format.

The GERBER file 452 may be received at a board assembly process 454 and used to create PCBs, such as a representative PCB 456. The PCB 456 may be manufactured in accordance with the design information indicated by the GERBER file 452. For example, the GERBER file 452 may be uploaded to one or more machines to perform one or more operations of a PCB production process. The PCB 456 may be populated with electronic components including the package 440 to form a representative printed circuit assembly (PCA) 458.

The PCA 458 may be received at a product manufacture process 460 and integrated into one or more electronic devices, such as a first representative electronic device 462 and a second representative electronic device 464. For example, the first representative electronic device 462 and/or the second representative electronic device 464 may include or correspond to the electronic device 300 of FIG. 3. The first representative electronic device 462 and/or the second representative electronic device 464 may include a mobile device (e.g., a cellular telephone), a computer (e.g., a laptop computer, a tablet computer, or a desktop computer), a set top box, an entertainment unit, a navigation device, a personal digital assistant (PDA), a television, a tuner, a radio (e.g., a satellite radio), a music player (e.g., a digital music player and/or a portable music player), a video player (e.g., a digital video player, such as a digital video disc (DVD) player and/or a portable digital video player), another electronic device, or a combination thereof.

One or more aspects described with respect to FIGS. 1-4 may be represented by the library file 412, the GDSII file 426, and/or the GERBER file 452. One or more aspects of the embodiments described with respect to FIGS. 1-4 may be represented by information stored at the memory 410 of the research computer 406, the memory 418 of the design computer 414, the memory 450 of the computer 446, and/or a memory of one or more other computers or processors (not shown) used at the various stages, such as at the board assembly process 454. One or more aspects of the embodiments described with respect to FIGS. 1-4 may be can also be incorporated into one or more other physical embodiments, such as the mask 432, the die 436, the package 440, the PCA 458, other products such as prototype circuits or devices (not shown), or any combination thereof. Although various representative stages of production from a physical device design to a final product are depicted, in other embodiments fewer stages may be used or additional stages may be included. Similarly, the electronic device manufacturing process 400 may be performed by a single entity or by one or more entities performing various stages of the electronic device manufacturing process 400.

Although one or more of FIGS. 1-4 may illustrate systems, apparatuses, and/or methods according to the teachings of the disclosure, the disclosure is not limited to these illustrated systems, apparatuses, and/or methods. One or more functions or components of any of FIGS. 1-4 as illustrated or described herein may be combined with one or more other portions of another of FIGS. 1-4. Accordingly, no single example should be construed as limiting and embodiments of the disclosure may be suitably combined without departing from the teachings of the disclosure.

Although certain components have been described generally, it is noted that implementations of such components may be selected based on the particular application. For example, depending on the particular application, the volatile/non-volatile SRAM control circuitry 170 may include one or more sense amplifiers, timing circuits (e.g., resistive-capacitive (RC) circuits), voltage dividers (e.g., resistive networks), pulse generators, counters, power-up detectors, and/or other devices selected to perform one or more operations described herein.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transitory storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method of operation of a static random access memory (SRAM) storage element, the method comprising:
   programming a value to the SRAM storage element prior to a power-down event; and
   in response to a power-on event at the SRAM storage element after the power-down event:
      increasing a supply voltage of the SRAM storage element; and
      sensing a state of the SRAM storage element to determine the value programmed to the SRAM storage element prior to the power-down event.

2. The method of claim 1, wherein the SRAM storage element has a susceptibility to the state, and wherein the susceptibility is created by increasing a threshold voltage difference between transistors of the SRAM storage element.

3. The method of claim 2, wherein increasing the threshold voltage difference includes biasing a first body terminal of a first transistor of the SRAM storage element with a first bias voltage.

4. The method of claim 3, wherein increasing the threshold voltage difference further includes biasing a second body terminal of a second transistor of the SRAM storage element with a second bias voltage that is different than the first bias voltage.

5. The method of claim 4, wherein the first bias voltage is a positive voltage, and wherein the second bias voltage is a ground voltage.

6. The method of claim 2, wherein the susceptibility corresponds to either a first logic value associated with a set operation or a second logic value associated with a reset operation.

7. The method of claim 1, wherein sensing the state includes ramping the supply voltage from a low voltage level to a supply voltage level and detecting a voltage of a bit line coupled to the SRAM storage element.

8. The method of claim 1, further comprising applying a volatile operation biasing scheme to the SRAM storage element to operate the SRAM storage element as a volatile storage element.

9. The method of claim 1, wherein the supply voltage is provided by control circuitry coupled to the SRAM storage element.

10. The method of claim 9, wherein the SRAM storage element and the control circuitry are integrated within an electronic device selected from a mobile device, a computer, a set top box, an entertainment unit, a navigation device, a personal digital assistant (PDA), a television, a tuner, a radio, a music player, a video player, or a combination thereof.

11. An apparatus comprising:
a static random access memory (SRAM) storage element; and
control circuitry coupled to the SRAM storage element, the control circuitry configured to program a value to the SRAM storage element prior to a power-down event, the control circuitry further configured, in response to a power-on event at the SRAM storage element after the power-down event, to increase a supply voltage of the SRAM storage element and to sense a state of the SRAM storage element to determine the value programmed to the SRAM storage element prior to the power-down event.

12. The apparatus of claim 11, wherein the control circuitry is further configured to create a susceptibility of the SRAM storage element to the state using a non-volatile operation biasing scheme.

13. The apparatus of claim 12, wherein the control circuitry is further configured to create the susceptibility using either a first biasing scheme to indicate a first logic value or a second biasing scheme to indicate a second logic value.

14. The apparatus of claim 13, wherein the control circuitry is further configured to bias a first body terminal of a first transistor of the SRAM storage element with a first bias voltage and to bias a second body terminal of a second transistor of the SRAM storage element with a second bias voltage that is different than the first bias voltage.

15. The apparatus of claim 14, wherein the first biasing scheme is used, and wherein the first bias voltage is a positive voltage, and wherein the second bias voltage is a ground voltage.

16. The apparatus of claim 14, wherein the second biasing scheme is used, and wherein the first bias voltage is a ground voltage, and wherein the second bias voltage is a positive voltage.

17. The apparatus of claim 13, wherein the control circuitry is further configured to sense the state using a third biasing scheme.

18. The apparatus of claim 11, wherein the control circuitry is further configured to operate the SRAM storage element as volatile storage using a volatile operation biasing scheme.

19. The apparatus of claim 11, further comprising an SRAM device, wherein the SRAM storage element and the control circuitry are integrated within the SRAM device.

20. The apparatus of claim 19, further comprising an electronic device selected from a mobile device, a computer, a set top box, an entertainment unit, a navigation device, a personal digital assistant (PDA), a television, a tuner, a radio, a music player, a video player, or a combination thereof, wherein the SRAM device is integrated within the electronic device.

21. An apparatus comprising:
means for accessing a static random access memory (SRAM) storage element; and
means for programming a value to the SRAM storage element prior to a power-down event, for increasing a supply voltage of the SRAM storage element in response to a power-on event at the SRAM storage element after the power-down event, and for sensing a state of the SRAM storage element after increasing the supply voltage to determine the value programmed to the SRAM storage element prior to the power-down event.

22. The apparatus of claim 21, wherein the means for accessing the SRAM storage element includes one or more word lines coupled to the SRAM storage element, one or more bit lines coupled to the SRAM storage element, or a combination thereof.

23. The apparatus of claim 21, wherein the means for increasing the supply voltage and for sensing the state includes control circuitry coupled to the SRAM storage element.

24. The apparatus of claim 21, further comprising an SRAM device, wherein the means for accessing the SRAM storage element and the means for increasing the supply voltage and for sensing the state are integrated within the SRAM device.

25. The apparatus of claim 24, further comprising an electronic device selected from a mobile device, a computer, a set top box, an entertainment unit, a navigation device, a personal digital assistant (PDA), a television, a tuner, a radio, a music player, a video player, or a combination thereof, wherein the SRAM device is integrated within the electronic device.

* * * * *